United States Patent [19]
Pezzani

[11] Patent Number: 5,631,493
[45] Date of Patent: May 20, 1997

[54] MONOLITHIC COMPONENT INCLUDING A PROTECTION DIODE IN PARALLEL WITH A PLURALITY OF PAIRS OF SERIES DIODES

[75] Inventor: Robert Pezzani, Vouvray, France

[73] Assignee: SGS-Thomson Microelectronics S.A., Saint Genis Pouilly, France

[21] Appl. No.: 278,637

[22] Filed: Jul. 21, 1994

[30]  Foreign Application Priority Data

Jul. 21, 1993 [FR] France .................... 93 09250

[51] Int. Cl.$^6$ .................................... H01L 29/00
[52] U.S. Cl. .................... 257/551; 257/356; 257/603
[58] Field of Search .......................... 257/551, 203, 257/356, 480, 484, 603

[56] References Cited

U.S. PATENT DOCUMENTS

| | | |
|---|---|---|
| 3,617,864 | 11/1971 | Senger . |
| 4,831,423 | 5/1989 | Shannon ............................ 257/212 |
| 5,338,964 | 8/1994 | Bernier ............................. 257/476 |

FOREIGN PATENT DOCUMENTS

| | | |
|---|---|---|
| 0318404 | 5/1989 | European Pat. Off. ......... H01L 27/08 |
| 0 562 982 A1 | 9/1993 | European Pat. Off. . |

OTHER PUBLICATIONS

Patent Abstracts Of Japan, vol. 12, No. 24 (E–576) Jan. 23, 1988 & JP–A–62 179 756.

Primary Examiner—Mark V. Prenty
Attorney, Agent, or Firm—David M. Driscoll; James H. Morris

[57]  ABSTRACT

A monolithic component incorporates a protection diode in parallel with a plurality of pairs of diodes having the same polarity. The monolithic component is formed from an N-type semiconductor substrate and includes P-type first regions that are formed at the upper surface of the substrate; second regions constituted by upper portions of the substrate, whose lateral surfaces are delineated by P-type insulating walls; a P-type third region at the bottom of the second regions; a fourth P$^+$-type region formed from the lower surface in the third region; a fifth N+-type region on the lower surface of the substrate; first metallizations connecting each of the first regions to each of the second regions; and a second metallization on at least one portion of the insulating wall.

26 Claims, 4 Drawing Sheets

MONOLITHIC COMPONENT INCLUDING A PROTECTION DIODE IN PARALLEL WITH A PLURALITY OF PAIRS OF SERIES DIODES

BACKGROUND OF THE INVENTION

1. Field of the Invention

The present invention relates to protection circuits, and more particularly to diode arrays for protecting differential pairs of digital telephone lines or data processing systems.

2. Discussion of the Related Art

In data processing systems, connectors are often connected to a plurality of lines whose voltage may vary between first and second states corresponding to first and second voltages.

In the following description, it will be assumed that the first voltage is zero and the second voltage is a positive voltage, for example +5 volts. However, it will be clear that, generally, the voltages of these lines may vary between a high voltage and a low voltage, or reference voltage.

A conventional protection circuit for a line of this type is illustrated in FIG. 1. Line L is connected to the reference voltage REF (ground) through a reverse biased diode d1 and is also connected to ground through a forward biased diode d'1 in series with a reverse biased avalanche diode Z whose threshold voltage is close to (slightly higher than) the high voltage on the line. Thus, a negative overvoltage on the line L flows to ground through diode d1 and a positive overvoltage, having a value higher than the nominal voltage of the line, flows through diode d'1 and avalanche diode Z.

This type of protection circuit uses a protection diode having a low avalanche voltage and/or having a high overvoltage absorption capacity, and therefore a large size, while limiting the parasitic capacitance applied to the circuit to be protected due to the presence of diodes d1 and d'1.

In fact, in data processing circuits, numerous lines are connected to a connector and it is therefore necessary to associate therewith numerous protection circuits such as the one of FIG. 1, all having a common avalanche diode. Such a circuit is illustrated in FIG. 2 in which are provided, in association with each Line L1–L8, a diode d1–d8 reverse connected to ground, and a diode d'1–d'8 forward connected to ground through an avalanche diode Z.

An embodiment of a monolithic integration of the circuit of FIG. 2, in which diodes d1–d8 and d'1–d'8 are Schottky diodes, has already been proposed by the applicant in European patent application EP-A-562,982 of Mar. 23, 1993.

The present invention provides an implementation in the form of a monolithic circuit of the circuit of FIG. 2 in which diodes d1–d8 and d'1–d'8 are junction diodes so that the device can ensure protection even against a very high current.

More generally, it will be noted that the circuit of FIG. 2 includes a protection diode Z across the terminals of which a plurality of pairs of diodes is connected. Each pair of diodes includes two diodes oriented so as to have the same polarity as the protection diode. Such a circuit can ensure other applications than the above described application for the formation of a protection diode array. For example, it can be seen with relation to FIG. 4 that such a circuit also corresponds to a self-protected rectifying bridge circuit.

SUMMARY OF THE INVENTION

Thus, the present invention generally relates to a monolithic component incorporating a protection diode in parallel with a plurality of pairs of diodes oriented to have the same polarity as the protection diode.

An object of the present invention is to provide such a component capable of absorbing high overcharges.

These objects are achieved according to the invention with a monolithic component, incorporating a protection diode in parallel with a plurality of pairs of diodes oriented so as to have the same polarity as the protection diode. The monolithic component is formed from a semiconductor substrate of a first conductivity type including first regions of a second conductivity type that are formed at the upper surface of the substrate; second regions constituted by upper portions of the substrate, whose lateral surfaces are delineated by insulating walls of the second conductivity type and whose bottoms correspond to a third region of the second conductivity type; a fourth highly doped region of the second conductivity type formed from the lower surface in the third region; a fifth highly-doped region of the first conductivity type on the lower surface of the substrate; first metallizations connecting each of the first regions to each of the second regions; and a second metallization on at least one portion of the insulating wall.

According to an embodiment of the invention, the component further includes a third metallization coating the rear surface.

According to an embodiment of the invention, the depth of the first regions, of the insulating walls and of the third region is larger than half the thickness of the substrate.

The present invention also provides the use of the above described monolithic component as a protection diode array, in which each of the first metallizations is connected to a line to be protected and the second metallization is connected to a reference voltage, for example ground.

According to another aspect of the invention, the second and third metallizations are connected to a d.c. power supply source in series with a resistor, the voltage of the power supply source being lower than the avalanche voltage of the protection diode.

The invention also provides the use of the above described monolithic component as a self-protected rectifying bridge for an n-phase a.c. power supply, including n first regions and n second regions, each i-th (i being comprised between 1 and n) first metallization connecting the i-th first region to the i-th second region and being connected to an i-th a.c. supply terminal, the second metallization forming a d.c. supply terminal, and the third metallization forming another d.c. supply terminal.

The foregoing and other objects, features, aspects and advantages of the invention will become apparent from the following detailed description of the present invention when taken in conjunction with the accompanying drawings.

DETAILED DESCRIPTION

As conventional in semiconductor structure representation, it will be noted that the various cross-sectional views and top views are not drawn to scale and, for the cross-sectional views, the outlines of the diffused regions are very schematic.

Figure 3A:
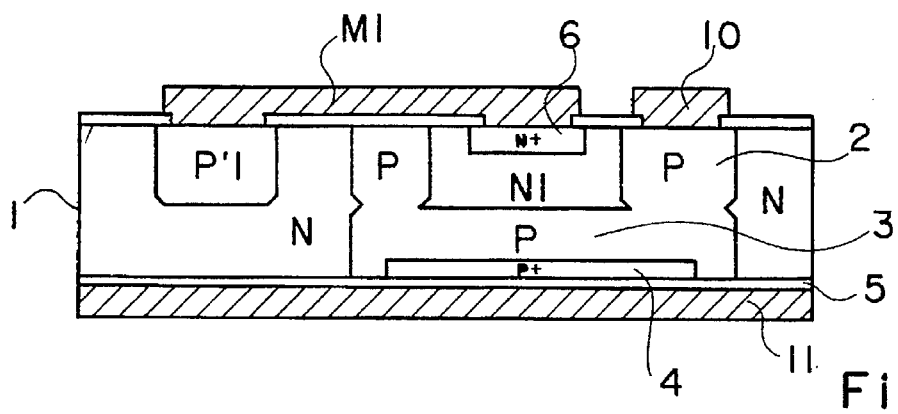
FIG. 3A is a cross-sectional view along line A—A of FIG. 3B of a structure according to the invention.
Figure 3B:
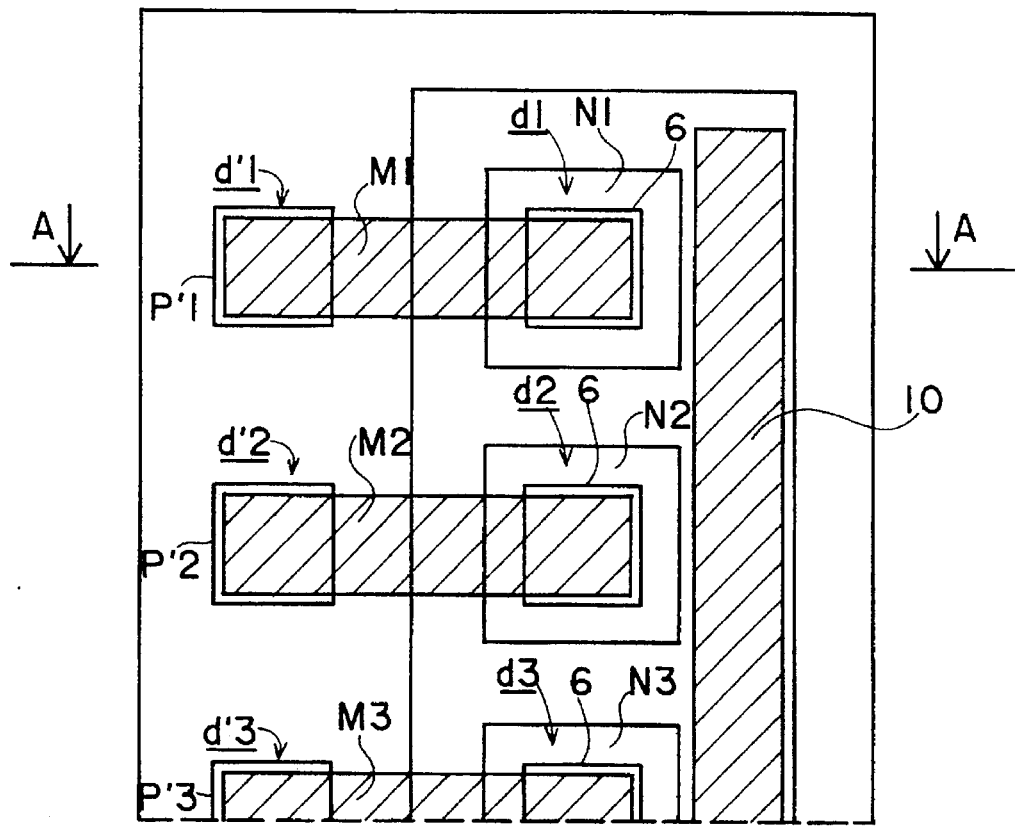
FIG. 3B is a partial top view of the structure of FIG. 3A, implementing the circuit diagram of FIG. 2.

As shown in FIGS. 3A and 3B, a monolithic protection array according to the invention is formed by using a substrate 1 of a first conductivity type, for example an N-type substrate.

Diodes d'1, d'2, d'3 . . . result from the diffusion, from an upper surface of this substrate, of P-type regions P'1, P'2, P'3 . . . , which constitute the anodes of these diodes. The common cathode of diodes d'1, d'2, d'3 . . . corresponds to substrate 1.

The cathodes N1, N2, N3 . . . of diodes d1, d2, d3 . . . are formed by regions of substrate 1, that are laterally delineated by a P-type insulation wall 2, and that end on a P-type region 3 formed from the lower surface of the substrate. This P-type region 3 corresponds to the common anode of diodes d1, d2, d3 . . .

The avalanche diode Z is formed from the lower surface of the substrate. Its anode is a $P^+$-type deep region 4 formed in the P-type region 3, and its cathode is an $N^+$-type region 5 formed on the whole lower surface of the substrate. The avalanche voltage is predominantly determined by the doping level of region 4. Although not represented in the top view of FIG. 3B, it will be clear that the P-type region 3 extends substantially over the whole width and the whole length of the region of the assembly delineated, as viewed from above, by the external outline of the insulation walls 2, and that the $P^+$-type region 4 substantially has the same surface. Thus, the avalanche diode has a junction surface much larger than that of each of diodes d1, d2, d3 . . . and d'1, d'2, d'3 . . .

Figure 2:
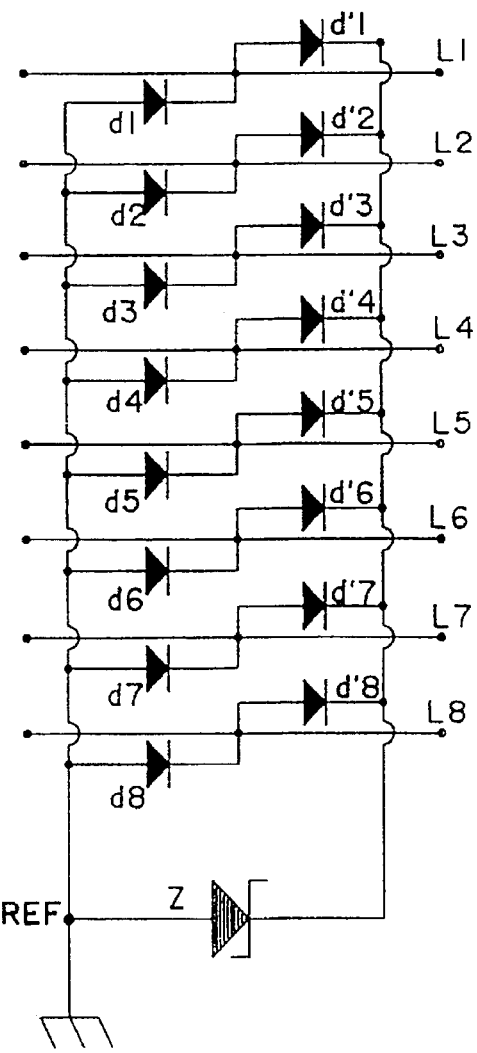

Preferably, an $N^+$-type region 6 is formed at the surface of each region N1, N2, N3 . . . Metallizations M1, M2, M3 . . . connect each region P'1, P'2, P'3 . . . to each overdoped region 6 formed in regions N1, N2, N3 . . . These metallizations are connected to each line L1, L2, L3 . . . of FIG. 2. A metallization 10 is formed on the surface of the insulation wall 2 and corresponds to the connection terminal with the reference voltage REF, usually the ground. Last, and preferably, a metallization 11 is formed over the whole lower surface to improve conductivity between the common cathodes of diodes d'1, d'2, d'3 . . . and the cathode region 5 of the avalanche diode positioned beneath the anode region 4 of this avalanche diode. In the described application, metallization 11 is held floating.

A manufacturing method of the structure of FIGS. 3A and 3B comprises the following successive steps:

simultaneously forming, from the upper and lower surfaces of the substrate, regions P'1, P'2, P'3 . . . , insulation walls 2 and region 3. This diffusion step is continued until the walls 2 formed from the upper surface contact the region 3 formed from the lower surface. Thus, if the thickness of the substrate is 240 µm, the diffusion depth is more than 120 µm;

forming, from the lower surface, the $P^+$-type region 4;

simultaneously forming, on the upper and lower surfaces, $N^+$-type regions 5 and 6; and forming metallizations.

One of the advantages of the structure according to the invention is its ability to withstand high avalanche current flows, regardless of the polarity of the overcharge.

a) If the metallization or terminal M1 receives an overcharge positive with respect to terminal M2, the diode d'1 is forward connected, current flows from region P'1 toward the metallization of the lower surface 11 (FIG. 3A), flows in the metallization 11 facing region N2 (FIG. 3B) and flows upward to metallization M2 through the $N^+$-$P^+$ junction that constitutes the reverse biased diode Z and through the P-N2 junction that constitutes the forward biased diode d2. It should be noted that the silicon regions are vertically flown through, without the presence of "planar" flow. Diodes d'1, d2, and Z are therefore used and behave like "discrete" components, and their flow ability is proportional to their size.

b) If terminal M1 receives an overcharge negative with respect to metallization M2, the circuit operates similarly.

c) If terminal M1 receives an overcharge positive with respect to ground 10, the circuit operates similarly as in a) but for the fact that diode d2 is not used. The current flows through the P-type regions 3,2 toward contact 10.

d) If terminal M1 is negative with respect to ground 10, the current flows through the lateral diode $PN1N^+$ (FIG. 3A). However, the P-type region delineating the well is constructed so as to be highly doped and to surround the well N1, which decreases the access resistance of diode d1 in this configuration.

Figure 1:
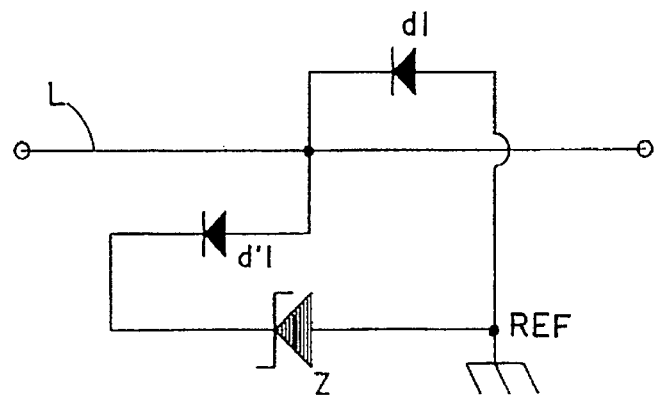
FIGS. 1 and 2, above described, are schematic circuit diagrams of protection diode arrays.

The above description addresses a structure fabricated by using an N-type substrate. It is also possible to devise an alternative embodiment of the invention in which all the conductivity types are reversed, that is, the P-type regions would be replaced by N-type regions, and vice versa. Since the structure to be fabricated is the structure shown in FIG. 1 or FIG. 2, this means that the terminal REF then corresponds to metallization 11 (lower surface). The diode d1 is constituted by $N1PP^+$ regions, diode d2 by $P^+P1N$ regions, and diode Z by $N^+P^+$ regions. In this case, the current through the various regions always vertically flows between metallizations M1, M2, M3 . . . and metallization 11 (metallization 10 is no longer connected). Accordingly, this structure, for a low voltage protection on a +5 V/0 V line for example, has the best protection effectiveness (the effectiveness corresponding to a high overcharge withstanding capacity and a low parasitic capacitance).

According to another advantage of the present invention, the size of the avalanche diode Z is proportional to the number of outputs. This means that the ability of diode Z to drain off an overcharge is "self-adapted" to the number of outputs.

According to a further advantage of the present invention, since the anode regions P'1, P'2, P'3 . . . of diodes d'1, d'2, d'3 . . . correspond to deep regions, the thickness of the underlying cathode region is reduced. Thus, the resistance in the conductive state of these diodes is reduced and, accordingly, the overvoltages occurring at the powering on of these diodes.

Figure 4:
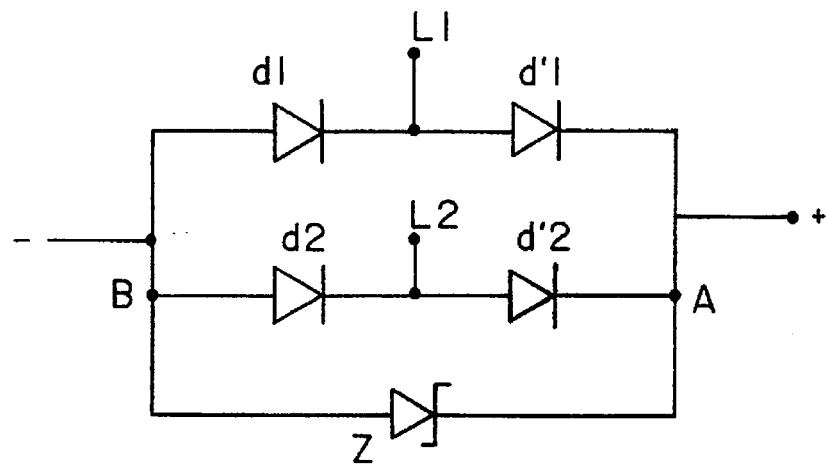
FIG. 4 illustrates an alternative application of the monolithic component according to the invention.

FIG. 4 illustrates an alternative embodiment of the component according to the invention. FIG. 4 shows the same elements represented in the drawing of FIG. 2 where only four diodes d1, d'1, d2, d'2 are provided. Those skilled in the art will note that, if the lines L1 and L2 to which the nodes of diodes d1–d'1 and d2–d'2 are respectively connected, are coupled to two terminals of an a.c. supply voltage, the circuit corresponds to a rectifying bridge which provides a rectified voltage to terminals A and B of diode Z; terminal A corresponds to the positive terminal and terminal B corresponds to the negative terminal. The component according to the invention then constitutes a rectifying bridge that is self-protected by an avalanche diode.

Figure 5:
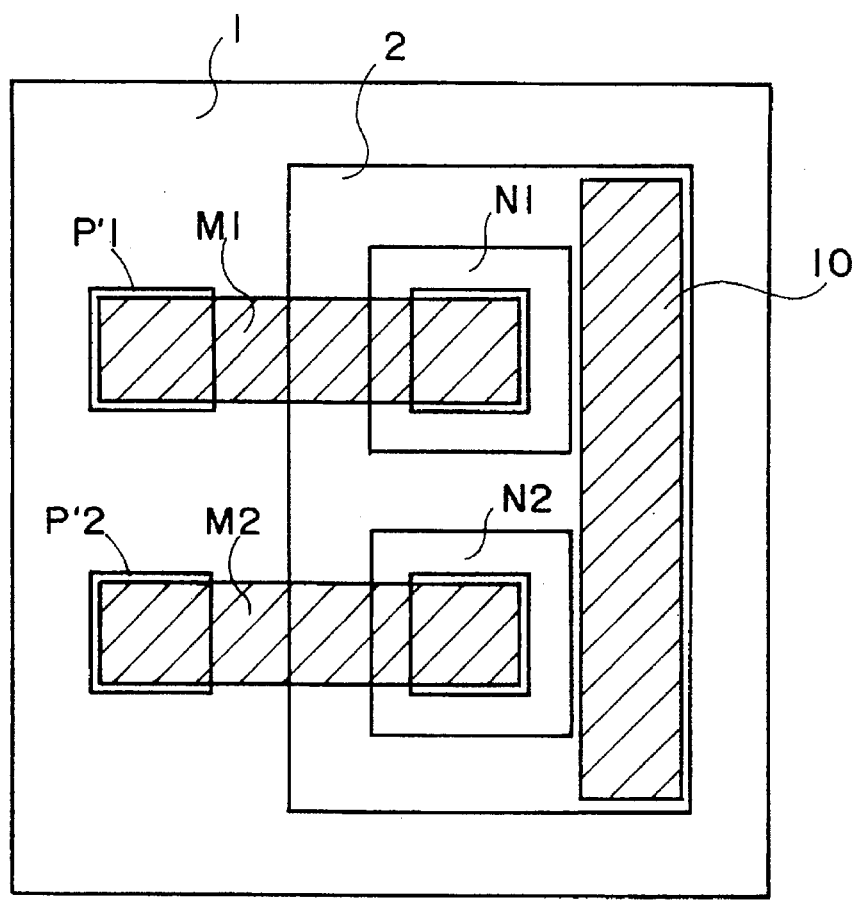
FIG. 5 is a partial top view of a structure according to the invention implementing the circuit of FIG. 4.

FIG. 5 is a schematic top view of an integrated circuit constituting an embodiment according to the invention of the circuit of FIG. 4. FIG. 5 is not described in detail because it uses the same reference characters as in FIG. 3B. In this case, metallizations M1 and M2 correspond to the a.c. supply terminals, and metallization 10 as well as the lower surface metallization 11 correspond to d.c. terminals.

Of course, the structure of FIGS. 4 and 5 also applies to the fabrication of an n-phase bridge. Then, there are provided n pairs of diodes d1 ... di ... dn, d'1 ... d'i ... d'n (i being comprised between 1 and n), and n first metallizations (Mi) connecting each i-th first region (P'i) to each i-th second region (Ni) that are connected to n a.c. supply terminals. The second metallization (10) constitutes a d.c. supply terminal, and the third metallization (11) constitutes the other d.c. supply terminal.

Figure 6:
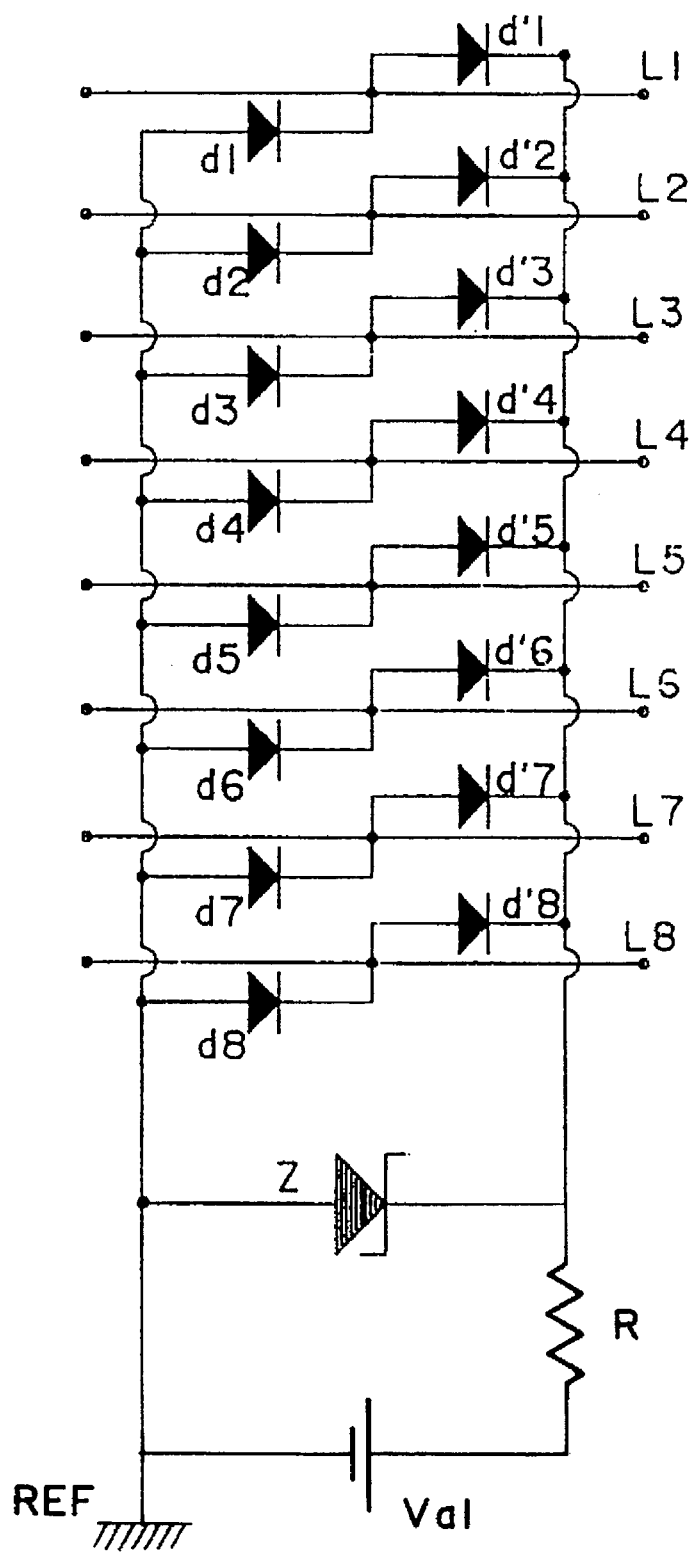
FIG. 6 illustrates an alternative embodiment of a protection diode array according to the invention.

An alternative embodiment of the protection component according to the invention is illustrated in FIG. 6. The protection component is connected to each line L1–L8, and the avalanche diode Z is connected to a power supply source Va1 through a resistor R.

As above, for a negative overcharge occurring between a line and ground, voltages are limited to 0 V plus the forward voltage drop (Vf) of a diode.

In contrast, for an overcharge positive with respect to value REF or for a line-to-line overcharge, two levels of protection are achieved.

For low amplitude overcharges, protection is effective at a threshold Va1+Vf for an overcharge positive with respect to value REF, and at a threshold ±Va1+Vf for a line-to-line current overcharge.

For high amplitude overcharges, resistor R increases the voltage across the avalanche diode Z to cause diode Z to limit the voltage at a higher level. It is thus possible, for example, to obtain a first threshold close to 4 to 5 V (fixed by Va1) and a second threshold close to 6 to 7 V (fixed by VZ). Therefore, this structure can protect circuits that are connected to the lines by using the power supply Va1, then protect the power supply source itself if the perturbation is too high.

As is apparent to those skilled in the art, various modifications can be made to the above disclosed preferred embodiments; in particular, the layouts of the various regions will be optimized to meet the required requisites.

Having thus described one particular embodiment of the invention, various alterations, modifications, and improvements will readily occur to those skilled in the art. Such alterations, modifications, and improvements are intended to be part of this disclosure, and are intended to be within the spirit and scope of the invention. Accordingly, the foregoing description is by way of example only and is not intended to be limiting. The invention is limited only as defined in the following claims and the equivalents thereto.

What is claimed is:

1. A monolithic component, incorporating a protection diode in parallel with a plurality of pairs of diodes oriented to have a same polarity as the protection diode, formed from a semiconductor substrate of a first conductivity type, the component including:

first regions of a second conductivity type at an upper surface of the substrate;

second regions of the first conductivity type at an upper portion of the substrate;

insulating walls of the second conductivity type around lateral surfaces of the second regions;

a third region of the second conductivity type at a lower surface of the second regions;

a fourth region of the second conductivity type at a lower surface of the third region;

a fifth region of the first conductivity type on a lower surface of the substrate;

first metallizations coupling each of the first regions to a respective second region; and a second metallization over the insulating wall.

2. The monolithic component of claim 1, further including a third metallization coupled to the fifth region.

3. The monolithic component of claim 1, wherein the fourth and fifth regions are highly doped regions.

4. The monolithic component of claim 1, wherein a depth of the first regions, of the insulating walls, and of the third region are each larger than half a thickness of the substrate.

5. A protection diode array for protecting a plurality of lines comprising:

a monolithic component, incorporating a protection diode in parallel with a plurality of pairs of diodes oriented to have a same polarity as the protection diode, formed from a semiconductor substrate of a first conductivity type, the component including:

first regions of a second conductivity type at an upper surface of the substrate;

second regions of the first conductivity type at an upper portion of the substrate;

insulating walls of the second conductivity type around lateral surfaces of the second regions;

a third region of the second conductivity type at a lower surface of the second regions;

a fourth region of the second conductivity type at a lower surface of the third region;

a fifth region of the first conductivity type on a lower surface of the substrate;

first metallization connecting each of the first regions to a respective second region; and a second metallizations on a portion of the insulating wall;

wherein each of the first metallizations is connected to a respective line to be protected, and wherein the second metallization is connected to a reference voltage.

6. The protection diode array of claim 5, wherein the reference voltage is ground.

7. The protection diode array of claim 5, further including a third metallization coupled to the fifth region.

8. The protection diode array of claim 7, wherein the second and third metallizations are connected to a d.c. power supply source in series with a resistor, the voltage of the power supply source being lower than the avalanche voltage of the protection diode.

9. The protection diode array of claim 5, wherein a depth of the first regions, of the insulating walls, and of the third region are each larger than half a thickness of the substrate.

10. A self-protected rectifying bridge for an n-phase power supply where n is an integer greater than one, comprising:

a substrate of a first conductivity type;

a.c. supply terminals;

n first regions of a second conductivity type at an upper portion of the substrate;

n second regions of the first conductivity type at an upper portion of the substrate;

n third regions of the second conductivity type at a lower surface of each of n respective second regions;

a fourth region of the second conductivity type at a lower surface of each of the third regions;

a fifth region of the first conductivity type on a lower surface of the substrate;

n first metallizations disposed on an upper surface of the substrate, the i-th first metallization connecting the i-th first region to the i-th second region and being connected to the i-th a.c. supply terminal wherein i is an integer from 1 to n;

a second metallization disposed on the upper surface of the substrate to connect the plurality of n third regions to one another to form a first d.c. supply terminal; and a third metallization connected to the fifth region to form a second d.c. supply terminal.

11. The monolithic component of claim 1 wherein the third region extends substantially over a whole width and a whole length of an insulation wall region as defined by the insulating walls around the lateral surfaces of the second regions.

12. The monolithic component of claim 11 wherein the fourth region has substantially the same surface area as the third region.

13. The monolithic component of claim 5 wherein the third region extends substantially over a whole width and a whole length of an insulation wall region as defined by the insulating walls around the lateral surfaces of the second regions.

14. The monolithic component of claim 13 wherein the fourth region has substantially the same surface area as the third region.

15. A monolithic component for protecting a line, comprising:

a semiconductor substrate of a first conductivity type;

a first diode disposed in the substrate, the first diode including a first region of a second conductivity type disposed at an upper surface of the substrate;

a second diode disposed in the substrate, the second diode including a second region of the first conductivity type disposed at an upper portion of the substrate and a third region of the second conductivity type disposed at a lower surface of the second region;

insulating walls of the second conductivity type disposed around lateral surfaces of the second region;

a protection diode disposed in the substrate, the protection diode including a fourth region of the second conductivity type disposed at a lower surface of the third region and a fifth region of the first conductivity type disposed on a lower surface of the substrate;

a first metallization disposed at the upper surface of the substrate to couple the first region to the second region; and a second metallization disposed on the substrate and coupled to the third region.

16. The monolithic component as recited in claim 15, further comprising:

a third metallization coupled to the fifth region.

17. The monolithic component of claim 16, wherein a depth of the first region, of the insulating walls, and of the third region are each larger than half a thickness of the substrate.

18. A self-protected rectifying bridge for rectifying an a.c. voltage, comprising:

first and second a.c. supply terminals;

a substrate of a first conductivity type;

a first diode disposed in the substrate, the first diode including a first region of a second conductivity type disposed at an upper surface of the substrate;

a second diode disposed in the substrate, the second diode including a second region of the first conductivity type disposed at an upper portion of the substrate and a third region of the second conductivity type disposed at a lower surface of the second region;

a third diode disposed in the substrate, the third diode including a fourth region of the second conductivity type disposed at an upper surface of the substrate;

a fourth diode disposed in the substrate, the fourth diode including a fifth region of the first conductivity type disposed at an upper portion of the substrate and a sixth region of the second conductivity type disposed at a lower surface of the fifth region;

insulating walls of the second conductivity type around lateral surfaces of the second and fifth regions;

a protection diode disposed in the substrate, the protection diode including a seventh region of the second conductivity type disposed at a lower surface of each of the third and sixth regions and an eighth region of the first conductivity type disposed on a lower surface of the substrate;

a first metallization coupling the first region of the first diode to the second region of the second diode;

a second metallization coupling the fourth region of the third diode to the fifth region of the fourth diode;

a third metallization coupling the third region of the second diode to the sixth region of the fourth diode to form a first d.c. supply terminal;

a fourth metallization coupled to the eighth region to form a second d.c. supply terminal; and wherein the first metallization is connected to the first a.c. supply terminal and the second metallization is connected to the second a.c. supply terminal.

19. A monolithic component, comprising:

a semiconductor substrate having top and bottom surfaces;

a pair of head-to-tail connected diode junctions implemented at the top surface of the semiconductor substrate; and a protection diode implemented at the bottom surface of the semiconductor substrate directly below a first of the diodes in the pair, the first of the diodes being interconnected to the protection diode via a portion of the substrate separating the first of the diodes from the protection diode.

20. The monolithic component of claim 19, further including a further pair of head-to-tail connected diode junctions implemented at the top surface of the semiconductor substrate, and wherein the protection diode is also directly below a first of the diodes in the further pair, the first of the diodes being interconnected to the protection diode via a portion of the substrate separating the first of the further diodes from the protection diode.

21. The monolithic component of claim 19, further including further pairs of head-to-tail connected diode junctions implemented at the top surface of the semiconductor substrate, and wherein the protection diode is also directly below a first of the diodes in each of the further pairs, each of the first of the further diodes being interconnected to the protection diode via a portion of the substrate separating it from the protection diode.

22. The monolithic component of claim 19 further comprising a metallization layer formed over the bottom surface of the semiconductor substrate.

23. The monolithic component of claim 19 wherein the diode junctions are constructed to form junction diodes.

24. A self-protected rectifying bridge for rectifying an n-phase a.c. voltage where n is an integer greater than one, comprising:

a substrate of a first conductivity type;

n a.c. supply terminals which receive the n-phase a.c. voltage;

n pairs of diodes dn and d'n disposed in the substrate, each diode dn including a first region of a second conductivity type disposed at an upper surface of the substrate;

each diode d'n including a second region of the first conductivity type disposed at an upper portion of the substrate and a third region of the second conductivity type disposed at a lower surface of the second region;

insulating walls of the second conductivity type around lateral surfaces of each second region in each diode d'n;

a protection diode disposed in the substrate, the protection diode including a fourth region disposed at a lower surface of each third region in each diode d'n and a fifth region of the first conductivity type disposed on a lower surface of the substrate;

n metallizations $M_i$ disposed on an upper surface of the substrate wherein the metallization $M_i$ connects the first region of diode d'i to the second region of diode di wherein i is an integer from 1 to n;

a first dc metallization disposed on the upper surface of the substrate to connect the third regions of diodes d'i to one another to form a first d.c. supply terminal where i is an integer from 1 to to n; and a second dc metallization connected to the fifth region to form a second d.c. supply terminal.

25. A monolithic component, incorporating a protection diode in parallel with a plurality of pairs of diodes oriented to have a same polarity as the protection diode, formed from a semiconductor substrate of a first conductivity type, the component including:

first regions of a second conductivity type at an upper surface of the substrate;

second regions of the first conductivity type at an upper portion of the substrate;

insulating walls of the second conductivity type around lateral surfaces of the second regions;

a third region of the second conductivity type at a lower surface of the second regions;

a fourth region of the second conductivity type at a lower surface of the third region;

first metallizations coupling each of the first regions to a respective second region; and a second metallization over the insulating wall, wherein a depth of the first regions, of the insulating walls, and of the third region are each larger than half a thickness of the substrate.

26. A protection diode array for protecting a plurality of lines comprising:

a monolithic component, incorporating a protection diode in parallel with a plurality of pairs of diodes oriented to have a same polarity as the protection diode, formed from a semiconductor substrate of a first conductivity type, the component including:

first regions of a second conductivity type at an upper surface of the substrate;

second regions of the first conductivity type at an upper portion of the substrate;

insulating walls of the second conductivity type around lateral surfaces of the second regions;

a third region of the second conductivity type at a lower surface of the second regions;

a fourth region of the second conductivity type at a lower surface of the third region;

first metallization connecting each of the first regions to a respective second region; and a second metallizations on a portion of the insulating wall;

wherein each of the first metallizations is connected to a respective line to be protected, and wherein the second metallization is connected to a reference voltage; and wherein a depth of the first regions, of the insulating walls, and of the third region are each larger than half a thickness of the substrate.

* * * * *